(12) United States Patent
Yin et al.

(10) Patent No.: US 8,530,328 B1
(45) Date of Patent: Sep. 10, 2013

(54) METHOD FOR MANUFACTURING SEMICONDUCTOR DEVICE

(75) Inventors: Haizhou Yin, Poughkeepsie, NY (US); Wei Jiang, Beijing (CN)

(73) Assignee: The Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/512,326

(22) Filed: May 26, 2012

Related U.S. Application Data

(63) Continuation of application No. PCT/CN2012/000463, filed on Apr. 9, 2012.

(30) Foreign Application Priority Data

Mar. 29, 2012 (CN) .......................... 2012 1 0088770

(51) Int. Cl.
*H01L 21/76* (2006.01)
(52) U.S. Cl.
USPC .................................. 438/424; 257/E21.546
(58) Field of Classification Search
USPC .................................. 438/424; 257/E21.546
See application file for complete search history.

(56) References Cited

U.S. PATENT DOCUMENTS

| 7,190,036 | B2 * | 3/2007 | Ko et al. | 257/374 |
| 2004/0063300 | A1 | 4/2004 | Chi | |
| 2006/0121688 | A1 | 6/2006 | Ko et al. | |
| 2007/0032039 | A1 | 2/2007 | Chen | |
| 2008/0124844 | A1 * | 5/2008 | Wong et al. | 438/130 |
| 2008/0315267 | A1 | 12/2008 | Hampp et al. | |
| 2010/0164000 | A1 * | 7/2010 | Dove | 257/368 |

FOREIGN PATENT DOCUMENTS

CN  101320728 A  10/2008

* cited by examiner

*Primary Examiner* — William D Coleman
*Assistant Examiner* — Christine Enad

(57) ABSTRACT

The present invention discloses a method for manufacturing a semiconductor device, comprising: forming a first shallow trench isolation in a substrate; forming a semiconductor device structure in an active region surrounded by the first shallow trench isolation; removing the first shallow trench isolation and leaving a shallow trench in the substrate; and filling the shallow trench with an insulating material to form a second shallow trench isolation. In the method for manufacturing the semiconductor device according to the present invention, after forming the shallow trench isolation with high stress, the high stress is memorized by the gate to enhance the stress in the channel region by etching, removing, and then backfilling the shallow trench isolation, so that the carrier mobility in the channel regions to be formed later can be increased and the device performance can be improved.

6 Claims, 2 Drawing Sheets

METHOD FOR MANUFACTURING SEMICONDUCTOR DEVICE

CROSS-REFERENCE TO RELATED APPLICATION

This application is a National Stage application of, and claims priority to, PCT Application No. PCT/CN2012/000463, filed on Apr. 9, 2012, entitled "Method for Manufacturing Semiconductor Device", which claimed priority to Chinese Application No. 201210088770.7, filed on Mar. 29, 2012. Both the PCT Application and Chinese Application are incorporated herein by reference in their entireties.

FIELD OF THE INVENTION

The present invention relates to a method for manufacturing a semiconductor device, and in particular, to a method for manufacturing a shallow trench by backfilling the shallow trench with a material with high stress after removing a shallow trench isolation so as to enhance the stress.

BACKGROUND OF THE INVENTION

Ever since the 90 nm CMOS integrated circuit technology, with the continuous reduction in the feature size of the device, the Strain Channel Engineering for the purpose of increasing the carrier mobility in the channel region is playing a more important role continuously. The carrier mobility can be effectively increased by introducing a stress into the channel region using a technology, so that the driving capability of the device can be enhanced.

As shown in Table 1 below, many researches have proved that there is a great difference between the piezoresistance coefficients of the NMOS and PMOS devices having channel regions with <110> crystal orientation on a (001) wafer, wherein the unit of the piezoresistance coefficient is $10^{-12}$ cm²/dyn.

|  | (001) wafer | | | |
|---|---|---|---|---|
|  | <100> | <100> | <110> | <110> |
| polarity | $\pi_\parallel$ $\pi_{11}$ | $\pi_\perp$ $\pi_{12}$ | $\pi_\parallel$ $(\pi_{11}+\pi_{12}+\pi_{44})/2$ | $\pi_\perp$ $(\pi_{11}+\pi_{12}-\pi_{44})/2$ |
| n-MOSFET | −42.6/−102 | −20.7/53.4 | −35.5/−31.6 | −14.5/−17.6 |
| p-MOSFET | 9.1/6.6 | −6.2/−1.1 | 71.7/71.8 | −33.8/−66.3 |

It can be seen that, in the direction of the width of the channel, i.e. in the direction of the horizontal axis, a tensile stress can improve the performance of both the NMOS and PMOS devices when the channel direction is <110> direction on the (001) wafer. In the direction of the length of the channel, i.e. in the direction of the vertical axis, it is preferable to use a different type of stress, such as a compressive stress, between the NMOS and PMOS devices when the channel direction is <110> direction on the (001) wafer. Therefore, the NMOS and PMOS devices can theoretically be manufactured by forming active regions (well regions) with different crystal orientations on the (001) wafer substrate, respectively, so that each of the MOSFETs has either a tensile stress or a compressive stress, thereby effectively increasing the carrier mobility. However, such a method requires extra complicated processes, for example, epitaxying active regions and well regions with different crystal orientations on the substrate, respectively, which prolong the process time and increase the manufacturing cost.

Another solution that is theoretically feasible is to apply a stress to the channel region by means of a stress occurring at the contact interface between different materials, especially materials with different crystal structures. As an example, a compressive stress and a tensile stress are caused by a mismatch between the crystal lattices of the substrate Si and the source region SiGe and between the crystal lattices of the substrate Si and the drain region SiC, respectively, which applies to the PMOS and NMOS devices. Likewise, in this solution, extra steps of etching the substrate to form trenches and performing epitaxial growth are required, which results in high cost.

Furthermore, a strained channel is formed before depositing a gate, and such stress may remain in the channel region after removing a stressed layer of shallow trench isolation (STI), that is, the gate can be used for memorizing (i.e., storing) the stress. Thus, it is desired that a stress may be applied to the channel region by appropriately designing and manufacturing the STI.

In summary, the existing methods for introducing a stress into the channel region may result in a complicated process and high cost.

SUMMARY OF THE INVENTION

In view of the above, an object of the present invention is to provide a method for introducing a stress into a channel region, which is easy, inexpensive and efficient.

To achieve the above object, the present invention provides a method for manufacturing a semiconductor device, comprising: forming a first shallow trench isolation in a substrate; forming a semiconductor device structure in an active region surrounded by the first shallow trench isolation; removing the first shallow trench isolation and to form a shallow trench in the substrate; and filling the shallow trench with an insulating material to form a second shallow trench isolation.

Preferably, removing the first shallow trench isolation further comprises: depositing an interlayer dielectric layer to cover the substrate, the first shallow trench isolation, and the semiconductor device structure; etching the interlayer dielectric layer to form an opening so as to expose the first shallow trench isolation; and etching the first shallow trench isolation to expose the substrate so as to form the shallow trench. Preferably, the width of the opening is greater than the width of the first shallow trench isolation.

Preferably, the material of the first shallow trench isolation and/or the second shallow trench isolation includes one of silicon oxide, silicon nitride, diamond-like amorphous carbon, and metal oxide with high stress.

Preferably, the stress of the first shallow trench isolation and/or second shallow trench isolation is greater than about 1 GPa.

Preferably, the first stress of the first shallow trench isolation is of the same type as the second stress of the second shallow trench isolation.

Preferably, the first stress of the first shallow trench isolation is of a different type from the second stress of the second shallow trench isolation, and the second stress is greater than that of the first stress.

In the method for manufacturing the semiconductor device according to the present invention, after forming the shallow trench isolation with high stress, the high stress is memorized by the gate to enhance the stress in the channel region by etching, removing, and then backfilling the shallow trench isolation, so that the carrier mobility in the channel regions to be formed later can be increased and the device performance can be improved.

BRIEF DESCRIPTION OF THE DRAWINGS

The technical solutions of the present invention will be described in detail below with reference to the accompanying drawings.

DETAILED DESCRIPTION OF THE PREFERRED EMBODIMENTS

The features and technical effects of the technical solutions of the present invention will be described in detail below with reference to the drawings and in combination with exemplary embodiments. A method for introducing a stress into a channel region easily, inexpensively and efficiently is disclosed. It shall be noted that like reference signs denote like structures, and the terms used in the present invention, such as "first", "second", "above", "below", and the like, can be used to modify various device structures or manufacturing processes. Unless specified otherwise, such modification does not imply the spatial, sequential or hierarchical relationships between the device structures or manufacturing processes.

The various steps of the method for manufacturing the device according to the present invention will be described in detail below with reference to the flow chart of FIG. 6 and in combination with the schematic cross-sectional views of FIGS. 1-5.

Figure 1:
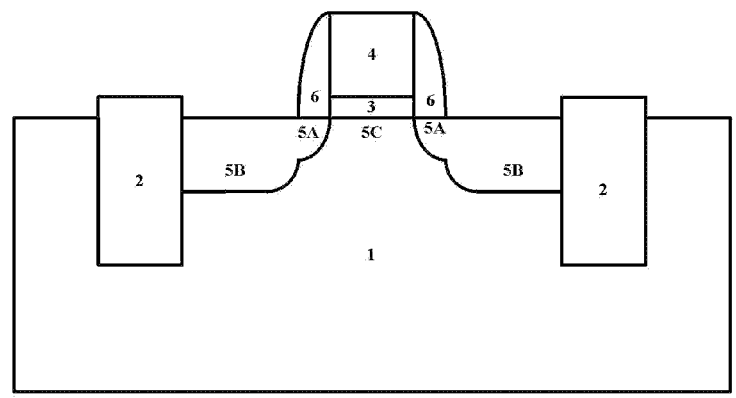
FIGS. 1-5 are schematic cross-sectional views of the various steps of a method for manufacturing a semiconductor device according to the present invention.

Referring to FIG. 1, a first shallow trench isolation 2 is formed in a substrate 1, and a semiconductor device structure is formed in an active region surrounded by the first shallow trench isolation 2.

The substrate 1 may be provided and appropriately selected according to the requirements for the application of the device. The material used as the substrate 1 may comprise one of monocrystal silicon (Si), Silicon On Insulator (SOI), monocrystal germanium (Ge), Germanium On Insulator (GeOI), strained silicon (strained Si), silicon germanium (SiGe), compound semiconductor materials, such as gallium nitride (GaN), gallium arsenide (GaAs), indium phosphide (InP), and indium antimonide (InSb), and carbon-based semiconductor, such as graphene, SiC, and carbon nanotube, etc. Preferably, the substrate 1 may be bulk silicon, e.g. a Si wafer, and SOI, so as to be compatible with the CMOS technology to apply to a digital logic integrated circuit.

A hard mask layer (not shown) is deposited on the substrate 1, and is photoetched/etched to form a hard mask layer pattern having an opening that exposes a part of the substrate 1. The hard mask layer may be a single layer or multi-layer. Preferably, the hard mask layer includes at least a first hard mask layer of oxide, e.g. silicon oxide, and a second hard mask layer of nitride, e.g. silicon nitride, or oxynitride, e.g. silicon oxynitride. By using such stacked hard mask layer, the precision of the etched pattern can be well controlled, and the surface of the substrate to be etched and covered by the stacked hard mask layer can be well protected. A photoresist (not shown) is spin coated and is exposed and developed to form a photoresist pattern. A hard mask layer opening is formed by performing anisotropic etching in the hard mask layer by means of dry etching, such as plasma etching, using the photoresist pattern as a mask, until the substrate 1 is exposed. At this time, the surface of the substrate 1 is not over-etched due to the stacked structure of the hard mask layer, so the defect density of the surface is not increased.

The part of substrate 1 exposed in the opening is etched using the hard mask layer pattern as a mask until reaching a certain depth H under the surface of the substrate 1. Preferably, the substrate 1 may be etched in an anisotropic manner by means of dry etching. When the material of the substrate 1 is Si, a solution having good anisotropy used for wet etching, such as TMAH, may also be used for the etching.

Preferably, a pad layer (not shown) may be deposited in the shallow trench by means of a conventional depositing method, such as LPCVD, PECVD, HDPCVD, and ALD, etc., so as to eliminate defects on the surface of the shallow trench in the substrate and to limit the volume expansion of the STI to be formed later. The material used as the pad layer may be preferably different from both the material of the substrate 1 and the insulating material of the STI to be formed later. As an example, when the material of the substrate 1 is Si and the material of the STI to be formed later is silicon oxide, the material of the pad layer is a nitride, e.g., silicon nitride, or oxynitride, e.g., silicon oxynitride. Preferably, the pad layer may comprise a laminated structure, which includes at least a first pad layer of oxide and a second pad layer of nitride. The total thickness of the pad layer is, for example, about 5~10 nm.

The shallow trench is filled with a material with high stress and is annealed to form a first shallow trench isolation 2. The material with high stress is deposited in the shallow trench by using a conventional depositing method, such as LPCVD, PECVD, HDPCVD, and ALD, etc. The material with high stress of the first shallow trench isolation 2 comprises one of silicon oxide, silicon nitride, diamond-like amorphous carbon (DLC), and metal oxide with high stress. The metal oxide includes, for example, a) a high-k material, which includes, but is not limited to, hafnium-based materials, such as $HfO_2$, $HfSiO_x$, HfSiON, $HfAlO_x$, $HfTaO_x$ $HfLaO_x$, $HfAlSiO_x$, and $HfLaSiO_x$, wherein the content x of the oxygen atom can be adjusted appropriately in each of the above materials according to the different proportions of the multiple metal components and the different chemical valences, which may be 1~6, for example, and is not limited to an integer; a rare earth based high-K dielectric material selected from a group consisting of $ZrO_2$, $La_2O_3$, $LaAlO_3$, $TiO_2$, and $Y_2O_3$; or $Al_2O_3$; or a composite layer of the above-mentioned materials; b) a refractory metal oxide, which includes, but is not limited to, $NiO_x$, and $WO_x$; iron-based oxide, such as $LnFeO_3$, $LnAMnFeO_6$, wherein Ln is one of Y, Pr, Nd, Sm, Gd, Tb, Dy, and Ho, etc., and A is one of Ca and Sr, etc.; and a combination thereof; c) amorphous oxide semiconductor, such as In-doped ZnO based semiconductors preferably including one of InGaZnO, InZnO, HfInZnO, TaInZnO, ZrInZnO, YInZnO, AlInZnO, and SnInZnO, or other binary or polynary amorphous oxide semiconductors preferably including one of $In_2O_3$, ZTO, ITO, ZnO, and $SnO_x$; and a combination of materials in the above a), b) and c), wherein each subscript x can be appropriately configured and adjusted according to the requirements for the stress of the material. For example, with respect to the materials in b) and c), x is 1~3 and is not limited to an integer. The annealing temperature is, for example, greater than about 900° C., and the annealing time is, for example, about 30 s to 10 min, so that the individual elements in the filing material are rearranged to form a stress. The first shallow trench isolation 2 may have a tensile stress or a compressive stress by adjusting parameters in the deposition process and the annealing process, and the magnitude of the stress (i.e., absolute value thereof, and all referring to the magnitude of a stress below will mean the absolute value of the stress) is greater than about 1 GPa, preferably between about 2~4 GPa. Then, the first shallow trench isolation 2 is planarized by CMP until the hard mask layer, e.g. the upper second hard mask layer, is exposed.

The hard mask layer is removed, and a semiconductor device structure is formed in the active region surrounded by the first STI 2. For example, the hard mask layer is removed by wet etching or dry etching A gate stack comprising a pad oxide layer (e.g. silicon oxide, not shown), a gate insulating layer 3 (e.g. high k material), a gate conductive layer 4 (e.g. doped polysilicon, metal, metal alloy, metal nitride) is formed on the surface of the active region of the substrate 1 surrounded by the first STI 2 by performing deposition and etching on the surface of the active region. A first ion implantation is performed on a source and drain using the gate stack as a mask to form lightly doped source and drain extension regions 5A. Gate spacers 6 made of silicon nitride are formed on the substrate 1 on both sides of the gate stack. A second ion implantation is performed on the source and drain using the gate spacers 6 as a mask to form heavily doped source and drain regions 5B. A channel region 5C is composed of a part of the substrate 1 between the source and drain regions 5A/5B. At this time, the intrinsic stress generated during the formation of the STI has been applied into the device structure, and is memorized by, for example, the gate stack.

So far, the manufacturing of the first STI 2 in the substrate 1 and the semiconductor device structure in the active region surrounded by the STI 2 has been completed using a standard CMOS process flow. It shall be noted that, although the embodiment of the present invention takes the semiconductor device which is specifically a single MOSFET as an example, multiple MOSFETs or multiple other devices, such as an array of memory units, photoelectric elements, and BiCMOS, etc., can be made in the active region surrounded by the STI 2.

Figure 2:
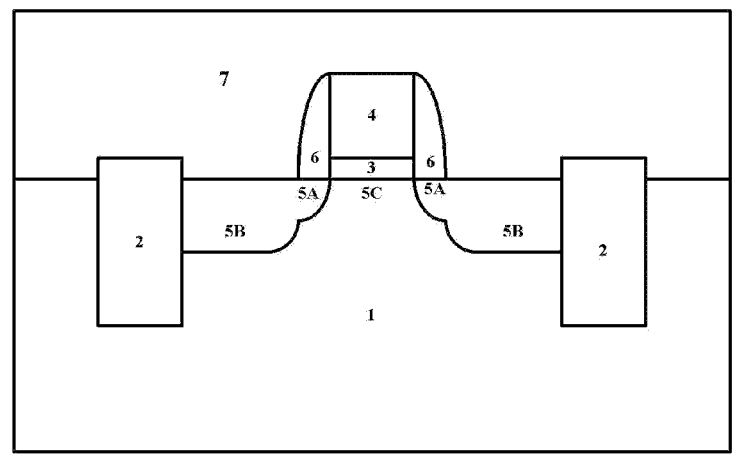

Referring to FIG. 2, an interlayer dielectric layer (ILD) 7 is formed on the whole wafer. The ILD 7 is deposited on the substrate 1, the STI 2, and the semiconductor device structure, such as MOSFET, by means of a conventional deposition method, such as LPCVD, PECVD, HDPCVD, and ALD. The ILD 7 is planarized by CMP until the top of the semiconductor device structure, e.g. the gate conductive layer 4, is exposed. The material of the ILD 7 is, for example, a low-k material, such as silicon oxide, spin-coating glass (SOG), BSG, and BPSG, wherein k<3.9, or k<2.8.

Figure 3:
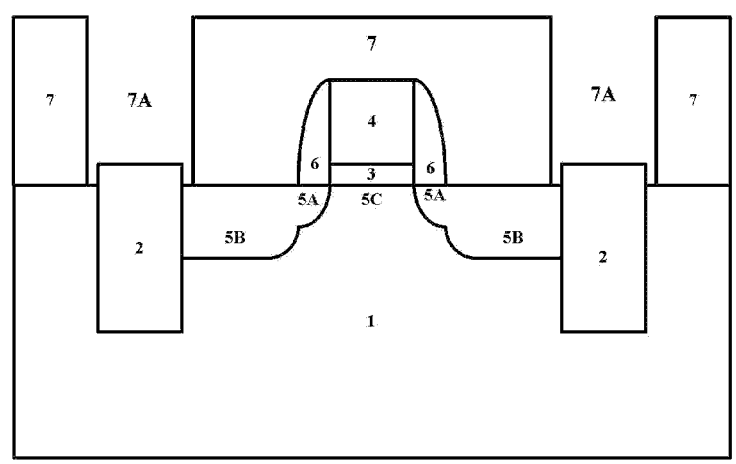

Referring to FIG. 3, the ILD 7 is etched to form an opening 7A to expose the first STI 2. A photoresist (not shown) is spin coated and is exposed and developed to form a photoresist pattern. The ILD 7 is etched using the photoresist pattern as a mask until reaching the upper surface of the substrate 1, thereby exposing the top of the first STI 2. For example, the ILD 7 is composed of silicon oxide as main chemical composition, while the composition of the STI 2 may not be limited to silicon oxide, but includes other materials, so that there is a high etching rate ratio between the STI 2 and the ILD 7. In this case, the ILD 7 may be etched by using a hydrofluoric acid based solution used for wet etching, i.e., a diluted hydrofluoric acid DHF, or a mixed solution of HF and $NH_4F$—a buffered etching solution, BOE. The etching rate may be controlled by selecting the concentration and temperature of the solution, and an etch stop may be chosen and set by controlling the etching time. Alternatively, the etching may automatically stop by plasma dry etching using, for example, fluorine based gas, such as carbon fluorine based gas, $NF_3$, and $SF_6$, and optionally oxygen, gas containing chlorine, and gas containing bromine, etc., and by selecting the etching time. As shown in FIG. 3, the width of the opening 7a is greater than the width of the STI 2 to facilitate the subsequent complete etching of the STI 2, thereby avoiding leaving any un-completely etched STI 2 due to a part of the ILD 7 overlaying on the STI 2.

Figure 4:
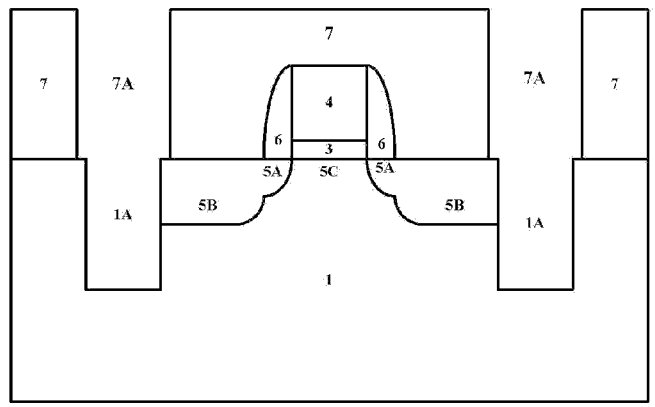

Referring to FIG. 4, the first STI 2 is removed by etching until the substrate 1 is exposed, and a shallow trench 1A is formed in the substrate 1. Likewise, an appropriate etching method may be selected according to the material of the STI 2. For example, when the material of the STI 2 is silicon nitride, it may be etched using hot phosphoric acid, when the material of the STI 2 is silicon oxynitride, it may be etched using hydrofluoric acid and oxidant, e.g. oxydol, or sulphuric acid, and when the material of the STI 2 is DLC and metal oxide, it may be etched using oxidant. The etching can be terminated by controlling the concentration and temperature of the etching solution and selecting the etching time. Alternatively, the etching can be done by means of plasma dry etching. After the completion of the etching, since the gate stack, e.g. the gate conductive layer, has a function of memorizing the stress, the stress still remains in the channel region 5C after the STI 2 with high stress has been removed.

Figure 5:
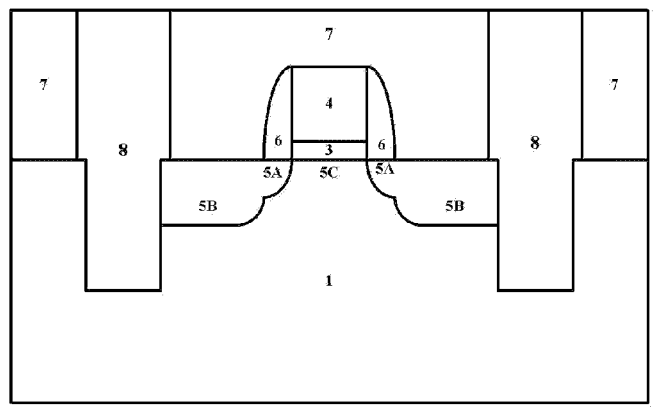
Figure 6:
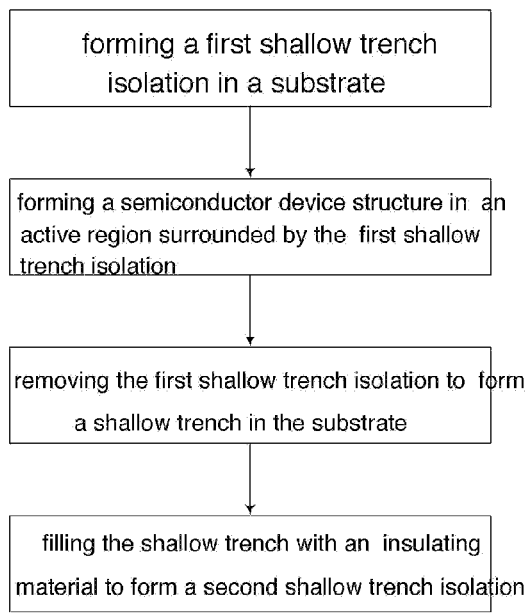
FIG. 6 is a flow chart of the method for manufacturing a semiconductor device according to the present invention.

Referring to FIG. 5, the shallow trench 1A is refilled with a material with high stress and is annealed to form a second shallow trench isolation 8. Identical or similar to the STI 2, the material of the STI 8 may be the same as or different from that of the STI 2. The STI 8 can have a high stress greater than about 1 GPa, preferably between about 2 to 4 GPa, by controlling parameters in the deposition process, as long as the material of the STI 8 is selected from the above-mentioned materials with high stress. Since the channel region 5C has already memorized the first stress applied by the STI 2, a second stress is generated in the STI 8 by backfilling so as to enhance the total stress applied to the channel region 5C, so that the device performance can be increased. Preferably, the STI 2 may be selectively etched, so that different types of stresses may be generated along the direction of the channel and the direction perpendicular to the channel, thereby increasing the performance of different types of MOSFETs. Specifically, the second stress of the STI 8 may be of the same type as the first stress of the STI 2, but the magnitude of the second stress is larger than that of the first stress. For example, when the first stress of the STI 2 is a compressive stress of about 1~2 GPa, the second stress of the STI 8 is a compressive stress of about 2~4 GPa, and vice versa, so that the stress in the channel region can be additionally enhanced. Alternatively, the second stress of the STI 8 may be of a different type from the first stress of the STI 2, but the absolute value of the second stress is larger than that of the first stress. For example, when the first stress of the STI 2 is a compressive stress of about 1~2 GPa, the second stress of the STI 8 is a tensile stress of about 2~4 GPa, and vice versa. This is for the purpose of easily and conveniently adjusting the type and magnitude of the stresses needed by different devices by first forming the stress in the NMOS or PMOS channel region of the CMOS and then selectively changing the type of the stress in the PMOS or NMOS, for example, only removing parts of the STI 2 around certain MOS transistor regions and backfilling the STI 8 rather than removing all of the STI 2. Preferably, after the STI 8 is formed, planarization may be performed by CMP until the ILD 7 is exposed.

Afterwards, alternatively, the ILD 7 is etched to form source and drain contact holes exposing the source and drain regions 5B. A self-alignment process is performed using a silicide on the source and drain contact holes to form a metal silicide (not shown) so as to reduce the source and drain resistances. Then, a metal is filled to form a contact plug (not shown). Thus, the manufacturing of the final device is completed.

In the method for manufacturing the semiconductor device according to the present invention, after forming the shallow trench isolation with high stress, the high stress is memorized by the gate to enhance the stress in the channel region by etching, removing, and then backfilling the shallow trench isolation, so that the carrier mobility in the channel regions to be formed later can be increased and the device performance can be improved.

Although the present invention has been illustrated with reference to one or more exemplary embodiments, it shall be understood by those ordinary skilled in the art that various appropriate changes and equivalents can be made to the device structure without departing from the scope of the present invention. In addition, many modifications that might be adapted to specific situations or materials can be made from the teaching disclosed by the present invention without departing from the scope thereof. Therefore, the present invention is not intended to be limited to the specific embodiments, which are disclosed as preferred implementations to carry out the invention, but the disclosed device structure and the method for manufacturing the same will include all embodiments that fall into the scope of the present invention.

What is claimed is:

1. A method for manufacturing a semiconductor device, comprising:
   forming a first shallow trench in a substrate;
   filing the first shallow trench with a material with high stress to form a first trench isolation in the substrate;
   forming a semiconductor device structure in an active region surrounded by the first shallow trench isolation;
   depositing an interlayer dielectric layer to cover the substrate, the first shallow trench isolation and the semiconductor device structure;
   etching the interlayer dielectric layer to form an opening exposing the first shallow trench isolation;
   completely removing the first shallow trench isolation by etching the first shallow trench isolation through the opening in the interlayer dielectric layer, so as to expose the substrate to form a shallow trench in the substrate;
   only filling the shallow trench in the substrate and the opening in the interlayer dielectric layer with an insulating material of high stress to form a second shallow trench isolation; and
   planarizing the insulating material of high stress in the second shallow trench isolation to make the second shallow trench isolation flush with the interlayer dielectric layer.

2. The method for manufacturing a semiconductor device according to claim 1, wherein the width of the opening is greater than the width of the first shallow trench isolation.

3. The method for manufacturing a semiconductor device according to claim 1, wherein the material with high stress and the insulating material of high stress include one of silicon oxide, silicon nitride, diamond-like amorphous carbon, and metal oxide.

4. The method for manufacturing a semiconductor device according to claim 1, wherein the stress of the first shallow trench isolation and/or the second shallow trench isolation is greater than about 1 GPa.

5. The method for manufacturing a semiconductor device according to claim 1, wherein the first stress of the first shallow trench isolation is of the same type as the second stress of the second shallow trench isolation.

6. The method for manufacturing a semiconductor device according to claim 1, wherein the first stress of the first shallow trench isolation is of a different type from the second stress of the second shallow trench isolation, and the second stress is greater than that of the first stress.

* * * * *